(12) United States Patent
Wang et al.

(10) Patent No.: US 11,444,262 B2
(45) Date of Patent: Sep. 13, 2022

(54) DISPLAY PANEL AND DISPLAY DEVICE HAVING A NON-PLANAR SUBSTRATE SURFACE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Shilong Wang, Beijing (CN); Zhiliang Jiang, Beijing (CN); Li Song, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 16/755,180

(22) PCT Filed: Oct. 15, 2019

(86) PCT No.: PCT/CN2019/111226
§ 371 (c)(1),
(2) Date: Apr. 10, 2020

(87) PCT Pub. No.: WO2020/103610
PCT Pub. Date: May 28, 2020

(65) Prior Publication Data
US 2021/0217988 A1 Jul. 15, 2021

(30) Foreign Application Priority Data
Nov. 19, 2018 (CN) .......................... 201811375358.7

(51) Int. Cl.
H01L 51/00 (2006.01)
H01L 51/52 (2006.01)
(Continued)

(52) U.S. Cl.
CPC ...... *H01L 51/5253* (2013.01); *H01L 51/0097* (2013.01); *H01L 51/56* (2013.01);
(Continued)

(58) Field of Classification Search
CPC ............. H01L 51/5253; H01L 51/0097; H01L 51/0096; H01L 2251/5338;
(Continued)

(56) References Cited

U.S. PATENT DOCUMENTS 10,263,214 B2 * 4/2019 Riegel ................ H01L 51/5253
2016/0043346 A1 * 2/2016 Kamiya ............. H01L 51/5246
257/40
(Continued)

FOREIGN PATENT DOCUMENTS

CN 203883009 U 10/2014
CN 106025092 A 10/2016
(Continued)

Primary Examiner — Ida M Soward
(74) Attorney, Agent, or Firm — The Webb Law Firm

(57) ABSTRACT

A display panel including a display area and a non-display area surrounding the display area, wherein the non-display area includes: a substrate, at least a part of a surface of the substrate being non-planar; and an inorganic layer conformally located on one side of the substrate and in contact with the at least a part of the surface.

19 Claims, 2 Drawing Sheets

(51) Int. Cl.
  *H01L 31/02* (2006.01)
  *H01L 33/22* (2010.01)
  *H01L 33/24* (2010.01)
  *H01L 51/56* (2006.01)
  *H01L 27/32* (2006.01)
  *H01L 31/0236* (2006.01)

(52) U.S. Cl.
  CPC .... *H01L 27/3244* (2013.01); *H01L 31/02366* (2013.01); *H01L 33/22* (2013.01); *H01L 33/24* (2013.01); *H01L 51/0096* (2013.01); *H01L 2251/301* (2013.01); *H01L 2251/5338* (2013.01)

(58) Field of Classification Search
  CPC ......... H01L 2251/301; H01L 31/02366; H01L 33/22; H01L 33/24
  See application file for complete search history.

(56) References Cited

U.S. PATENT DOCUMENTS

| | | | |
|---|---|---|---|
| 2017/0069873 A1 | 3/2017 | Kim et al. | |
| 2017/0110532 A1* | 4/2017 | Kim | H01L 51/0096 |
| 2017/0288004 A1* | 10/2017 | Kim | H01L 51/5246 |
| 2018/0061910 A1 | 3/2018 | Cai | |
| 2018/0102502 A1* | 4/2018 | Kim | H01L 22/12 |
| 2018/0159077 A1 | 6/2018 | Lee et al. | |
| 2018/0226604 A1 | 8/2018 | Gong et al. | |
| 2019/0051859 A1* | 2/2019 | Choi | H01L 27/3248 |
| 2019/0074479 A1* | 3/2019 | Lee | H01L 51/5253 |
| 2019/0267557 A1 | 8/2019 | Zhao et al. | |
| 2020/0035950 A1* | 1/2020 | Seo | H01L 27/3251 |
| 2020/0075700 A1* | 3/2020 | Cao | H01L 51/56 |
| 2020/0127216 A1* | 4/2020 | Tao | H01L 51/5256 |
| 2021/0057674 A1* | 2/2021 | Huang | H01L 51/5253 |
| 2021/0359252 A1* | 11/2021 | Wang | H01L 51/56 |
| 2021/0367198 A1* | 11/2021 | Ma | H01L 51/5253 |

FOREIGN PATENT DOCUMENTS

| | | | |
|---|---|---|---|
| CN | 107046105 A | | 8/2017 |
| CN | 107068715 A | | 8/2017 |
| CN | 107507931 A | | 12/2017 |
| CN | 107689424 A | | 2/2018 |
| CN | 108155300 A | | 6/2018 |
| CN | 207441754 U | | 6/2018 |
| CN | 108321173 A | * | 7/2018 |
| CN | 108336118 A | | 7/2018 |
| CN | 108832017 A | | 11/2018 |
| CN | 109473465 A | | 3/2019 |

\* cited by examiner

DISPLAY PANEL AND DISPLAY DEVICE HAVING A NON-PLANAR SUBSTRATE SURFACE

CROSS-REFERENCE TO RELATED APPLICATIONS

This application is the United States national phase of International Application No. PCT/CN2019/111226 filed Oct. 15, 2019, and claims priority to China Patent Application No. 201811375358.7 filed on Nov. 19, 2018, the disclosures of which are hereby incorporated by reference in their entirety.

TECHNICAL FIELD

The present disclosure relates to a display panel and a method for manufacturing the same, and a display device.

BACKGROUND

At present, in an active matrix organic light emitting diode (AMOLED) display panel, water vapor and oxygen are prevented from entering a display area of the display panel mainly by an encapsulation layer.

SUMMARY

According to one aspect of the embodiments of the present disclosure, a display panel is provided. The display panel comprises a display area and a non-display area surrounding the display area, wherein the non-display area comprises: a substrate, at least a part of a surface of the substrate being non-planar; and an inorganic layer conformally located on one side of the substrate and in contact with the at least a part of the surface.

In some embodiments, the display panel further comprises: an encapsulation layer located on one side of the inorganic layer away from the substrate, wherein a part of the surface of the substrate not covered by the encapsulation layer is non-planar.

In some embodiments, the non-display area further comprises: at least one dam located on the one side of the inorganic layer away from the substrate, wherein the encapsulation layer covers the at least one dam and is in contact with a part of the inorganic layer.

In some embodiments, at least a part of a surface of the part of the inorganic layer in contact with the encapsulation layer is non-planar.

In some embodiments, the at least one dam comprises a first dam and a second dam located on one side of the first dam away from the display area, and a surface of a part of the inorganic layer located between the first dam and the second dam is non-planar.

In some embodiments, the second dam has a height greater than a height of the first dam.

In some embodiments, the at least a part of the surface defines at least one of a protrusion or a recess.

In some embodiments, the substrate comprises a first flexible substrate layer, a second flexible substrate layer, and a barrier layer located between the first flexible substrate layer and the second flexible substrate layer, wherein the at least a part of the surface of the second flexible substrate layer away from the first flexible substrate layer is non-planar.

In some embodiments, the inorganic layer comprises a first inorganic layer in contact with the at least a part of the surface and a second inorganic layer located on one side of the first inorganic layer away from the substrate.

In some embodiments, a material of each of the first flexible substrate layer and the second flexible substrate layer comprises organic material, and a material of the barrier layer comprises inorganic material.

In some embodiments, a material of one of the first inorganic layer and the second inorganic layer comprises silicon nitride, and a material of the other comprises silicon oxynitride.

According to another aspect of the embodiments of the present disclosure, a method for manufacturing a display panel is provided. The method comprises forming a display area and a non-display area surrounding the display area, wherein forming the non-display area comprises: providing a substrate; processing at least a part of a surface of the substrate such that the at least a part of the surface is non-planar; and forming an inorganic layer conformally located on one side of the substrate and in contact with the at least a part of the surface.

In some embodiments, the method further comprises: forming an encapsulation layer located on one side of the inorganic layer away from the substrate, wherein a surface of a part of the substrate not covered by the encapsulation layer is non-planar.

In some embodiments, the method further comprises: forming at least one dam located on one side of the inorganic layer away from the substrate before forming the encapsulation layer, wherein the encapsulation layer covers the at least one dam and is in contact with a part of the inorganic layer.

In some embodiments, at least a part of a surface of the part of the inorganic layer in contact with the encapsulation layer is non-planar.

In some embodiments, the at least one dam comprises a first dam and a second dam located on one side of the first dam away from the display area, and a surface of a part of the inorganic layer located between the first dam and the second dam is non-planar.

In some embodiments, the second dam has a height greater than a height of the first dam.

In some embodiments, the at least a part of the surface defines at least one of a protrusion or a recess.

In some embodiments, the processing comprises at least one of etching or imprinting.

According to a further aspect of the embodiments of the present disclosure, a display device is provided. The display device comprises the display panel according to any one of the above embodiments.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure can be more clearly understood from the following detailed description with reference to the accompanying drawings, in which.

Figure 1:
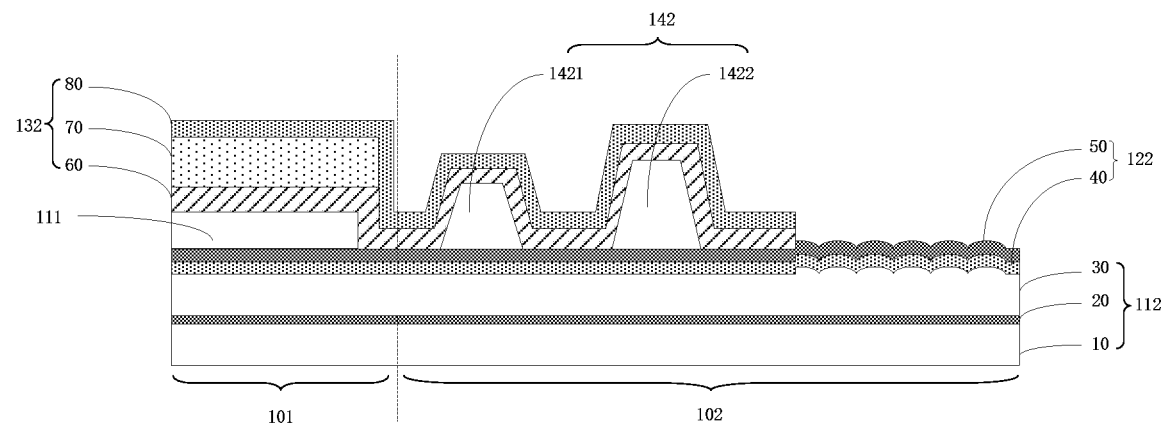
FIG. 1 is a schematic structural view showing a display panel according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noticed that some areas of the inorganic layer on the substrate of the non-display area of the display panel, which are not covered by the encapsulation layer, might be damaged due to various reasons (e.g., manufacturing, transport or the like).

In the related art, the substrate of the non-display area has a planar surface, and thus bonding force between the inorganic layer and the substrate is small. Once certain areas of the inorganic layer are damaged, water vapor and oxygen entering the interface between the inorganic layer and the substrate from the damaged areas easily cause the inorganic layer to be separated from the substrate, and further enter the display area along a channel where the inorganic layer is separated from the substrate. Eventually, water vapor and oxygen entering the display area will reduce the display effect of the display panel.

To solve the above problems, the embodiments of the present disclosure provide the following technical solutions.

FIG. 1 is a schematic structural view showing a display panel according to an embodiment of the present disclosure.

As shown in FIG. 1, the display panel comprises a display area 101 and a non-display area 102 surrounding the display area 101.

The non-display area 102 comprises a substrate 112. At least a part of a surface of the substrate 112 is non-planar. As some examples, the non-planar surface of the substrate 112 may be, for example, a surface with wavy topography. For example, at least a part of the surface of the substrate 112 has at least one non-planar topographic feature of protrusion or recess. It should be understood that the protrusion/recess mentioned here is protrusion/recess relative to the planar surface of the substrate 112.

In some embodiments, the substrate 112 may comprise a first flexible substrate layer 10, a second flexible substrate layer 30, and a barrier layer 20 located between the first flexible substrate layer 10 and the second flexible substrate layer 30. At least a part of the surface of the second flexible substrate layer 30 away from the first flexible substrate layer 10 may be non-planar. As examples, the materials of the first flexible substrate layer 10 and the second flexible substrate layer 30 may comprise, for example, organic materials such as polyimide (PI). As examples, the material of the barrier layer 20 may comprise, for example, inorganic material such as silicon oxynitride. The barrier layer 20 may make the substrate 112 unlikely to bend on one hand and may prevent water vapor and oxygen below the substrate 112 from entering the display area 101 on the other hand.

The non-display area 102 further comprises an inorganic layer 122 conformally located on one side of the substrate 112 and in contact with the non-planar surface of the substrate 112 (i.e., the at least a part of the surface described above). In some embodiments, the inorganic layer 122 may comprise a first inorganic layer 40 and a second inorganic layer 50 located on one side of the first inorganic layer 40 away from the substrate 112. In this case, the first inorganic layer 40 may be in contact with the non-planar surface of the substrate 112. As some implementations, the material of one of the first inorganic layer 40 and the second inorganic layer 50 may comprise silicon nitride, and the material of the other may comprise silicon oxynitride. The inorganic layer 122 may prevent water vapor and oxygen from entering the thin film transistor(s) in the display area 101 through the substrate 112.

In the above embodiments, at least a part of the surface of the substrate of the non-display area is non-planar, and the inorganic layer is conformally located on one side of the substrate and in contact with the non-planar surface of the substrate. In such a display panel, the inorganic layer and the substrate of the non-display area have increased bonding force therebetween and thus not easily separate from each other. In this way, the possibility of water vapor and oxygen entering the channel formed after the inorganic layer is separated from the substrate is reduced, the adverse effect of water vapor and oxygen on the performance of the display area is reduced, and the display effect of the display panel is improved.

In some embodiments, referring to FIG. 1, the non-display area 102 further comprises an encapsulation layer 132 on one side of the inorganic layer 122 away from the substrate 112. In some embodiments, the encapsulation layer 132 may be a thin film encapsulation layer comprising a first barrier layer 60, a second barrier layer 80, and a buffer layer 70 located between the first barrier layer 60 and the second barrier layer 80. The materials of the first barrier layer 60 and the second barrier layer 80 may comprise, for example, inorganic materials, and the material of the buffer layer 70 may comprise, for example, organic material.

It should be noted that the encapsulation layer 132 shown in FIG. 1 may also cover a light emitting device 111 in the display area 101. The light emitting device 111 may comprise, for example, a first electrode layer, a second electrode layer, and a light emitting layer located between the first electrode layer and the second electrode layer. The light emitting device 111 may further comprise one or more of an electron transport layer, an electron injection layer, a hole transport layer, and a hole injection layer. In some embodiments, the light emitting device 111 may be, for example, an OLED (organic light emitting diode) or QLED (a quantum dot light emitting diode).

It should be understood that a wiring layer may be disposed between the light emitting device 111 and the inorganic layer 122 in the display area 101 and between the encapsulation layer 132 and the inorganic layer 122 in the non-display area 102. For example, the wiring layer may comprise one or more of inorganic layers such as a gate dielectric layer, an interlayer insulating layer, and a planarization layer.

In some implementations, the surface of a part of the substrate 112 that is not covered by the encapsulation layer 132 is non-planar, as shown in FIG. 1. In other words, the edge of the encapsulation layer 132 may serve as a boundary line, and the surface of a part of the substrate 112 located on one side of the edge of the encapsulation layer 132 away from the display area 101 may be non-planar. In such a structure which is easily implemented, the inorganic layer 122 and the substrate 112 has increased bonding force therebetween, and thus not likely to be separated from each other.

In other embodiments, referring to FIG. 1, the non-display area 102 may further comprise at least one dam 142 on one side of the inorganic layer 122 away from the substrate 112. The dam 142 is configured to prevent the buffer layer 70 in the encapsulation layer 132 from flowing during the manufacturing process of the buffer layer 70. Here, the encapsulation layer 132 covers the dam 142 and is in contact with a part of the inorganic layer 122. For example, the first barrier layer 60 and the second barrier layer 80 may cover the surface of the dam 142. In some embodiments, the dam 142 may comprise a first dam 1421 and a second dam 1422 located on one side of the first dam 1421 away from the display area 101. In some embodiments, the height of the second dam 1422 may be greater than that of the first dam 1421, more effectively preventing the buffer layer 70 from flowing during the manufacturing process. It should be understood that the height here refers to a height in a direction from the substrate 112 to the inorganic layer 122.

As examples, the dam 142 may be formed during a process of forming a pixel defining layer and a planarization layer of the display panel. That is, the dam 142 may comprise one or more of the pixel defining layer and the planarization layer.

In some implementations, at least a part of the surface of a part of the inorganic layer 122 that is in contact with the encapsulation layer 132 may be non-planar, which will be described below in conjunction with FIG. 2.

Figure 2:
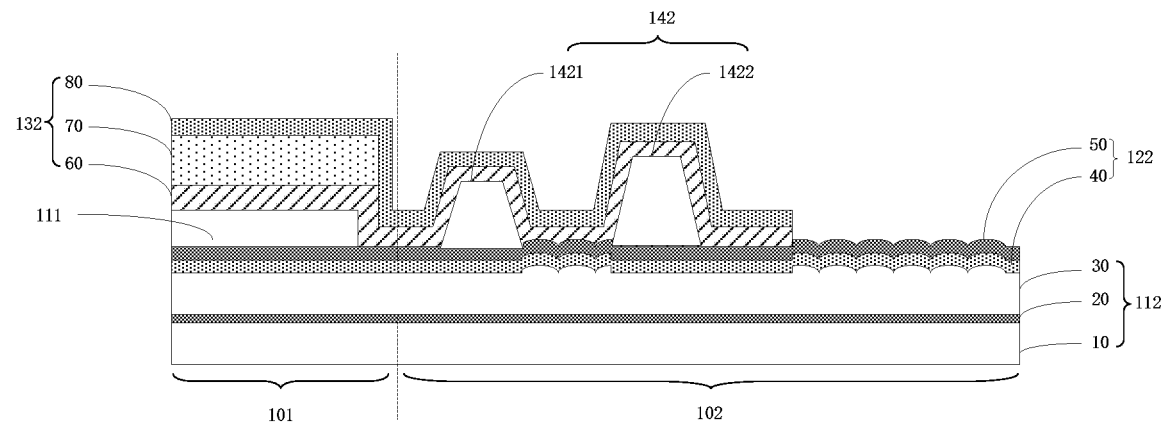
FIG. 2 is a schematic structural view showing a display panel according to another embodiment of the present disclosure.

FIG. 2 is a schematic structural view showing a display panel according to another embodiment of the present disclosure.

As shown in FIG. 2, the surface of a part of the inorganic layer 122 located between the first dam 1421 and the second dam 1422 is non-planar. In such a display panel, the inorganic layer 122 and the encapsulation layer 132 have increased bonding force therebetween, and thus not easily separate from each other. Therefore, the possibility of water vapor and oxygen entering the display area through a channel formed after the inorganic layer 122 is separated from the encapsulation layer 132 is reduced, and the display effect of the display panel is further improved.

For example, the projection of the first dam 1421 on the substrate 112 and the projection of the second dam 1422 on the substrate 112 are a first projection and a second projection respectively. The surface of a part of the substrate 112 between the first projection and the second projection may be non-planar, making the surface of the inorganic layer 122 conformally formed on this part of the substrate 112 be non-planar.

As another example, the surface of the part of the substrate 112 between the first projection and the second projection may be a planar surface. The surface of the part of the inorganic layer 122 between the first dam 1421 and the second dam 1422 can be changed to be non-planar by additional process.

Figure 3:
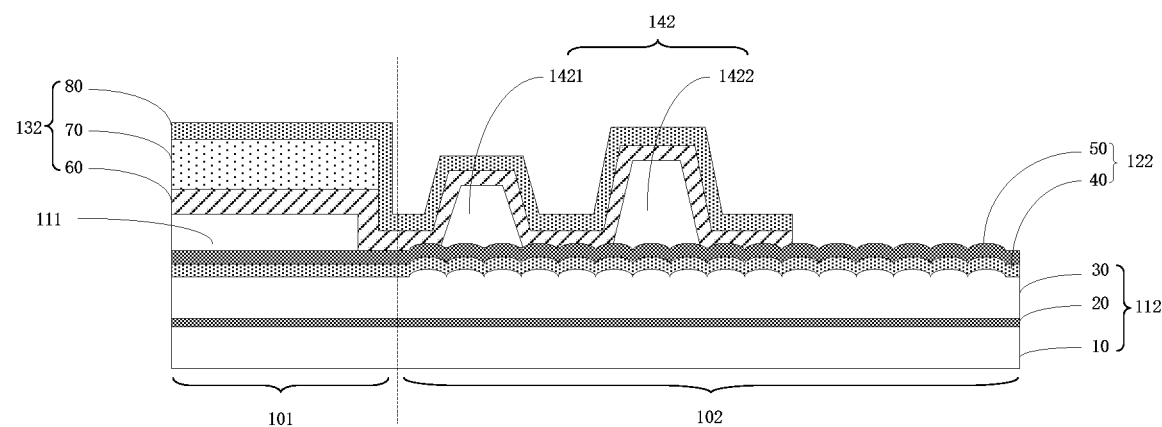
FIG. 3 is a schematic structural view showing a display panel according to a further embodiment of the present disclosure.

FIG. 3 is a schematic structural view showing a display panel according to a further embodiment of the present disclosure.

As shown in FIG. 3, the entire surface of the substrate 112 of the non-display area 102 may be non-planar. In such a display panel, bonding force between the inorganic layer 122 and the substrate 112 and bonding force between the inorganic layer 122 and the encapsulation layer 132 are still further improved, and the display effect of the display panel is thereby further improved.

The present disclosure also provides a method for manufacturing the display panel of any one of the above embodiments. The method comprises forming a display area and a non-display area surrounding the display area. The process of forming the non-display area will be described below in conjunction with FIG. 4.

Figure 4:
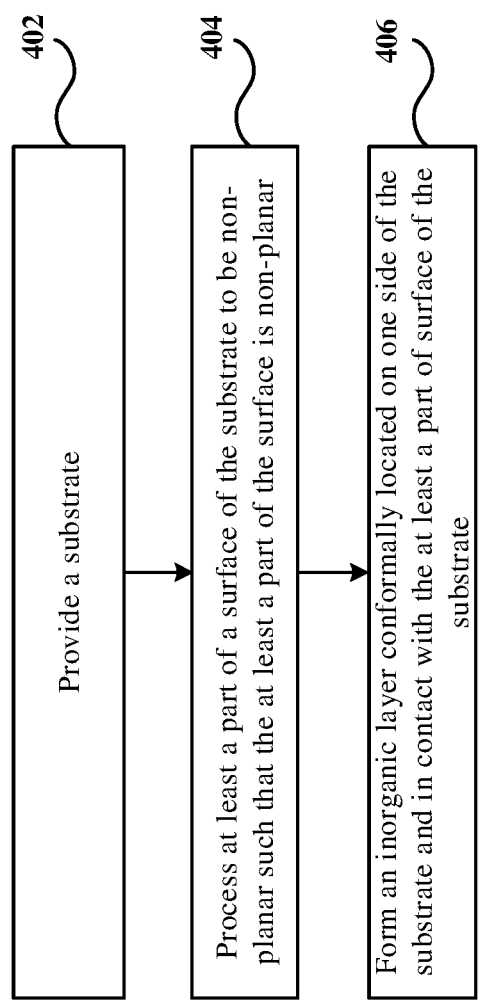
FIG. 4 is a schematic view showing a flowchart of forming a non-display area in a method for manufacturing a display panel according to an embodiment of the present disclosure.

FIG. 4 is a schematic view showing a flowchart of forming a non-display area in a method for manufacturing a display panel according to an embodiment of the present disclosure.

At step 402, a substrate is provided. The substrate may comprise, for example, a first flexible substrate layer, a second flexible substrate layer, and a barrier layer located between the first flexible substrate layer and the second flexible substrate layer.

At step 404, at least a part of a surface of the substrate is processed such that the at least a part of the surface is non-planar.

Being processed above may comprise, for example, being etched, being imprinted, or a combination of both. In some embodiments, the processed surface may define at least one of protrusion or recess. As examples, the processed surface may be of a wavy topography.

For example, at least a part of the surface of the second flexible substrate layer may be processed so that the processed surface is non-planar.

At step 406, an inorganic layer conformally located on one side of the substrate and in contact with the at least a part of surface of the substrate which is non-planar is formed.

In some implementations, the inorganic layer may comprise a first inorganic layer conformally located on the substrate and a second inorganic layer conformally located on the first inorganic layer. The first inorganic layer is in contact with the non-planar surface of the substrate (e.g., the non-planar surface of the second flexible substrate layer).

In some embodiments, after the inorganic layer is formed, an encapsulation layer, such as a thin film encapsulation layer, located on one side of the inorganic layer away from the substrate may be formed. In some embodiments, the surface of a part of the substrate that is not covered by the encapsulation layer may be non-planar.

In some embodiments, before the encapsulation layer is formed, at least one dam, such as a first dam and a second dam located on one side of the first dam away from the display area, located on one side of the inorganic layer away from the substrate may also be formed. The encapsulation layer may cover the at least one dam and be in contact with a part of the inorganic layer.

In some embodiments, at least a part of the surface of a part of the inorganic layer that is in contact with the encapsulation layer may be non-planar, increasing bonding force between the inorganic layer and the encapsulation layer. For example, the surface of a part of the inorganic layer that is located between the first dam and the second dam may be non-planar.

The present disclosure also provides a display device, which may comprise the display panel of any one of the above embodiments. In some embodiments, the display device may be any product or member having a display function, such as a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising a display area and a non-display area surrounding the display area, wherein the non-display area comprises:
   a substrate, at least a part of a surface of the substrate being non-planar;
   an inorganic layer conformally located on one side of the substrate and in contact with the at least a part of the surface;
   at least one dam located on the one side of the inorganic layer away from the substrate; and
   an encapsulation layer located on one side of the inorganic layer away from the substrate, wherein a part of the surface of the substrate not covered by the encapsulation layer is non-planar, and the encapsulation layer covers the at least one dam and is in contact with a part of the inorganic layer.

2. The display panel according to claim 1, wherein at least a part of a surface of the part of the inorganic layer in contact with the encapsulation layer is non-planar.

3. The display panel according to claim 2, wherein the at least one dam comprises a first dam and a second dam located on one side of the first dam away from the display area, and a surface of a part of the inorganic layer located between the first dam and the second dam is non-planar.

4. The display panel according to claim 3, wherein the second dam has a height greater than a height of the first dam.

5. The display panel according to claim 1, wherein the at least a part of the surface defines at least one of a protrusion or a recess.

6. The display panel according to claim 1, wherein the substrate comprises a first flexible substrate layer, a second flexible substrate layer, and a barrier layer located between the first flexible substrate layer and the second flexible substrate layer, wherein the at least a part of the surface of the second flexible substrate layer away from the first flexible substrate layer is non-planar.

7. The display panel according to claim 6, wherein the inorganic layer comprises a first inorganic layer in contact with the at least a part of the surface and a second inorganic layer located on one side of the first inorganic layer away from the substrate.

8. The display panel according to claim 6, wherein a material of each of the first flexible substrate layer and the second flexible substrate layer comprises organic material, and a material of the barrier layer comprises inorganic material.

9. The display panel according to claim 7, wherein a material of one of the first inorganic layer and the second inorganic layer comprises silicon nitride, and a material of the other comprises silicon oxynitride.

10. A display device, comprising the display panel according to claim 1.

11. A method for manufacturing a display panel, comprising forming a display area and a non-display area surrounding the display area, wherein forming the non-display area comprises:
   providing a substrate;
   processing at least a part of a surface of the substrate such that the at least a part of the surface is non-planar;
   forming an inorganic layer conformally located on one side of the substrate and in contact with the at least a part of the surface;
   forming at least one dam located on one side of the inorganic layer away from the substrate; and
   forming an encapsulation layer located on one side of the inorganic layer away from the substrate, wherein a surface of a part of the substrate not covered by the encapsulation layer is non-planar, wherein the encapsulation layer covers the at least one dam and is in contact with a part of the inorganic layer.

12. The method according to claim 11, wherein at least a part of a surface of the part of the inorganic layer in contact with the encapsulation layer is non-planar.

13. The method according to claim 12, wherein the at least one dam comprises a first dam and a second dam located on one side of the first dam away from the display area, and a surface of a part of the inorganic layer located between the first dam and the second dam is non-planar.

14. The method according to claim 13, wherein the second dam has a height greater than a height of the first dam.

15. The method according to claim 11, wherein the at least a part of the surface defines at least one of a protrusion or a recess.

16. The method according to claim 11, wherein the processing comprises at least one of etching or imprinting.

17. A display panel, comprising a display area and a non-display area surrounding the display area, wherein the non-display area comprises:
   a substrate, at least a part of a surface of the substrate being non-planar; and
   an inorganic layer conformally located on one side of the substrate and in contact with the at least a part of the surface,
   wherein the substrate comprises a first flexible substrate layer, a second flexible substrate layer, and a barrier layer located between the first flexible substrate layer and the second flexible substrate layer, wherein the at least a part of the surface of the second flexible substrate layer away from the first flexible substrate layer is non-planar, and
   wherein the inorganic layer comprises a first inorganic layer in contact with the at least a part of the surface and a second inorganic layer located on one side of the first inorganic layer away from the substrate.

18. The display panel according to claim 17, wherein a material of each of the first flexible substrate layer and the second flexible substrate layer comprises organic material, and a material of the barrier layer comprises inorganic material.

19. The display panel according to claim 17, wherein a material of one of the first inorganic layer and the second inorganic layer comprises silicon nitride, and a material of the other comprises silicon oxynitride.

* * * * *